(12) United States Patent
Zhang et al.

(10) Patent No.: US 9,478,665 B2
(45) Date of Patent: Oct. 25, 2016

(54) THIN FILM TRANSISTOR, METHOD OF MANUFACTURING THE SAME, DISPLAY SUBSTRATE AND DISPLAY APPARATUS

(71) Applicant: BOE Technology Group Co., Ltd., Beijing (CN)

(72) Inventors: Feng Zhang, Beijing (CN); Zhanfeng Cao, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,992

(22) PCT Filed: Nov. 27, 2014

(86) PCT No.: PCT/CN2014/092362
§ 371 (c)(1),
(2) Date: Aug. 19, 2015

(87) PCT Pub. No.: WO2016/011755
PCT Pub. Date: Jan. 28, 2016

(65) Prior Publication Data
US 2016/0254388 A1 Sep. 1, 2016

(30) Foreign Application Priority Data
Jul. 22, 2014 (CN) .......................... 2014 1 0351335

(51) Int. Cl.
*H01L 29/786* (2006.01)
*H01L 27/12* (2006.01)
(Continued)

(52) U.S. Cl.
CPC ....... *H01L 29/78606* (2013.01); *G02F 1/1368* (2013.01); *H01L 21/76801* (2013.01);
(Continued)

(58) Field of Classification Search
CPC .............. H01L 29/78606; H01L 2924/13069; H01L 2924/1011; H01L 2924/1015; H01L 27/1158; H01L 51/0508
See application file for complete search history.

(56) References Cited

U.S. PATENT DOCUMENTS

2013/0256666 A1   10/2013  Chang et al.
2015/0021591 A1*  1/2015   Kim .................. H01L 29/78645
                                                                  257/43

FOREIGN PATENT DOCUMENTS

CN         202423298 U      9/2012
CN         103000694 A      3/2013
(Continued)

OTHER PUBLICATIONS

International Search Report and Written Opinion for PCT Application No. PCT/CN2014/092362, dated Apr. 24, 2015, 10 pages.
(Continued)

*Primary Examiner* — Thanhha Pham
(74) *Attorney, Agent, or Firm* — Westerman, Champlin & Koehler, P.A.

(57) ABSTRACT

A thin film transistor is disclosed in the present invention. The thin film transistor comprises: a substrate, an active layer, a first etching barrier layer, a second etching barrier layer, a source and a drain, wherein: the active layer is disposed over the substrate; the first etching barrier layer is disposed over the active layer; the second etching barrier layer is disposed over the first etching barrier layer; the source and the drain are disposed over the second etching barrier layer, and are connected to each other through the active layer by means of via holes formed in the first etching barrier layer and the second etching barrier layer by etching; and a length of the first etching barrier layer at a channel position is less than a length of the second etching barrier layer. A method of manufacturing the thin film transistor, an array substrate and a display apparatus are also disclosed in the present invention. A length of a channel of the thin film transistor according to the present invention is less than the length of the channel of the conventional thin film transistor. Thereby, size and energy consumption of the thin film transistor are reduced, an aperture ratio of a liquid crystal panel is increased, and a turn-on current of the thin film transistor is increased, so that whole performance of the thin film transistor is further improved.

17 Claims, 3 Drawing Sheets

(51) Int. Cl.
  *G02F 1/1368* (2006.01)
  *H01L 29/66* (2006.01)
  *H01L 51/05* (2006.01)
  *H01L 21/768* (2006.01)

(52) U.S. Cl.
  CPC ... *H01L21/76829* (2013.01); *H01L 21/76831* (2013.01); *H01L 27/127* (2013.01); *H01L 27/1225* (2013.01); *H01L 29/66969* (2013.01); *H01L 29/7869* (2013.01); *H01L 29/78618* (2013.01); *H01L 29/78696* (2013.01); *H01L 51/0529* (2013.01); *G02F 2201/40* (2013.01)

(56) References Cited

FOREIGN PATENT DOCUMENTS

| | | |
|---|---|---|
| CN | 203179897 U | 9/2013 |
| CN | 103594476 A | 2/2014 |
| CN | 104167447 A | 11/2014 |

OTHER PUBLICATIONS

English translation of Box No. V from the Written Opinion of the International Search Authority for PCT Application No. PCT/CN2014/092362, 2 pages.

\* cited by examiner

THIN FILM TRANSISTOR, METHOD OF MANUFACTURING THE SAME, DISPLAY SUBSTRATE AND DISPLAY APPARATUS

CROSS-REFERENCE TO RELATED APPLICATION

This application is a Section 371 National Stage Application of International Application No. PCT/CN2014/092362, filed 27 Nov. 2014, which claims the benefit of Chinese Patent Application No. 201410351335.8 filed on Jul. 22, 2014 in the State Intellectual Property Office of China, the whole disclosure of which is incorporated herein by reference.

BACKGROUND

1. Technical Field

The present invention relates to the field of display, and particularly to a Thin Film Transistor (TFT), a method of manufacturing the same, a display substrate and a display apparatus.

2. Description of the Related Art

Figure 1A:
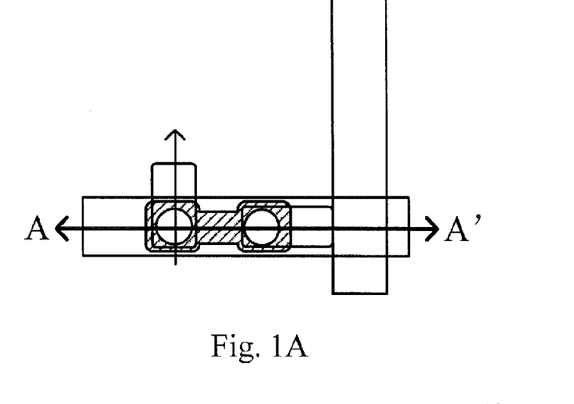
FIG. 1A is a schematic structural view of a conventional oxide thin film transistor.
Figure 1B:
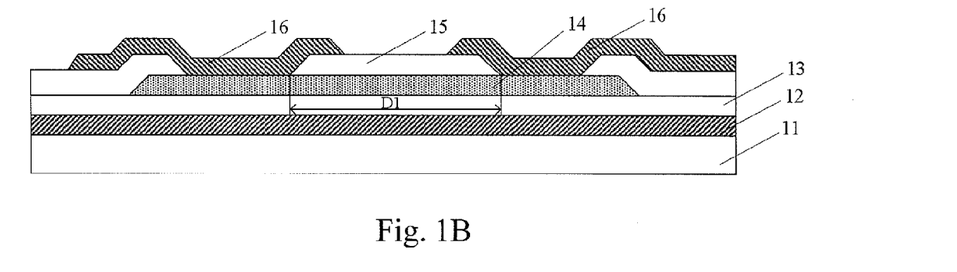
FIG. 1B is a sectional view of the oxide thin film transistor shown in FIG. 1A, which is taken along the line A-A' in FIG. 1A.

FIG. 1A is a schematic structural view of a conventional etching barrier type oxide thin film transistor, and FIG. 1B is a sectional view of the oxide thin film transistor shown in FIG. 1A, which is taken along the line A-A' in FIG. 1A. As shown in FIGS. 1A and 1B, 11 denotes a substrate, 12 denotes a gate, 13 denotes a gate insulation layer, 14 denotes an active layer, 15 denotes an etching barrier layer, and 16 denotes a source and a drain, in FIG. 1B. A length of a channel of the thin film transistor will affect a turn-on current of the thin film transistor. The less the length of the channel is, the more the turn-on current of the thin film transistor is. However, the conventional oxide thin film transistor has a long channel and a small turn-on current, which seriously lowers performance of the thin film transistor and adversely affects development of a high-performance display apparatus.

SUMMARY

In order to solve the problem existing in the above prior art, the present invention provides a thin film transistor, a method of manufacturing the same, a display substrate and a display apparatus.

In accordance with an aspect of the present invention, there is provided a thin film transistor comprising: a substrate, an active layer, a first etching barrier layer, a second etching barrier layer, a source and a drain, wherein:

the active layer is disposed over the substrate;

the first etching barrier layer is disposed over the active layer;

the second etching barrier layer is disposed over the first etching barrier layer;

the source and the drain are disposed over the second etching barrier layer, and are connected to each other through the active layer by means of via holes which are formed in the first etching barrier layer and the second etching barrier layer by etching; and a length of the first etching barrier layer at a channel position is less than a length of the second etching barrier layer at the channel position.

In accordance with an aspect of the present invention, the first etching barrier layer has a greater etch rate than the second etching barrier layer.

In accordance with an aspect of the present invention, a deposition rate for forming the first etching barrier layer is greater than that for the second etching barrier layer.

In accordance with an aspect of the present invention, both the first etching barrier layer and the second etching barrier layer are made of silicon oxide; or the first etching barrier layer is made of silicon nitride while the second etching barrier layer is made of silicon oxide.

In accordance with an aspect of the present invention, the thin film transistor further comprises a passivation layer disposed over the source and the drain.

In accordance with an aspect of the present invention, the active layer is made of metal oxide semiconductor material.

In accordance with an aspect of the present invention, the via holes are formed in the first etching barrier layer and the second etching barrier layer by a single etching process.

In accordance with another aspect of the present invention, there is also provided an array substrate comprising the abovementioned thin film transistor.

In accordance with a further aspect of the present invention, there is also provided a display apparatus comprising the abovementioned array substrate.

In accordance with a still another aspect of the present invention, there is also provided a method of manufacturing a thin film transistor, the method comprising steps of:

forming a semiconductor layer over a substrate and patterning the semiconductor layer so as to obtain an active layer;

forming a first etching barrier material layer on the active layer;

forming a second etching barrier material layer on the first etching barrier material layer;

forming, by etching, via holes in the first etching barrier layer and the second etching barrier layer such that a length of the first etching barrier layer at a channel position is less than a length of the second etching barrier layer at the channel position; and forming an electrode material layer on the second etching barrier layer, and patterning the electrode material layer so as to obtain a source and a drain, wherein the source and the drain are connected to each other through the active layer by means of the via holes formed in the first etching barrier layer and the second etching barrier layer.

In accordance with an aspect of the present invention, the first etching barrier material layer has a greater etch rate than the second etching barrier material layer.

In accordance with an aspect of the present invention, a deposition rate for forming the first etching barrier layer is greater than that for the second etching barrier layer.

In accordance with an aspect of the present invention, both the first etching barrier material layer and the second etching barrier material layer are made of silicon oxide; or the first etching barrier layer is made of silicon nitride while the second etching barrier layer is made of silicon oxide.

In accordance with an aspect of the present invention, the active layer is made of metal oxide semiconductor material.

In accordance with an aspect of the present invention, the method further comprises a step of forming a passivation layer on the source and the drain after the source and the drain are formed.

In accordance with an aspect of the present invention, the via holes are formed in the first etching barrier layer and the second etching barrier layer by a single etching process.

According to the above technical solutions, in the thin film transistor according to the present invention, two etching barrier layers are disposed and the property that the first etching barrier layer at a lower position has a greater etch rate than the second etching barrier layer at an upper position is utilized. Therefore, an etched portion of the first etching barrier layer having a greater etch rate is greater than an etched portion of the second etching barrier layer having a smaller etch rate. As a result, a tapered groove structure or a tapered via hole structure is formed in the first etching barrier layer and the second etching barrier layer, shortening a transmission distance of carriers between the source and the drain and thus decreasing a length of a channel of the thin film transistor. Because of the small length of the channel, a size of the thin film transistor can be reduced, an aperture ratio of a liquid crystal panel is increased, and energy consumption is reduced. In addition, because of the small length of the channel, a turn-on current of the thin film transistor can be increased, and a charging efficiency is raised, so that whole performance of the thin film transistor is greatly improved, thereby facilitating development of high-resolution products.

DETAILED DESCRIPTION OF THE EMBODIMENTS

The object, technical solutions and advantages of the present invention will be apparent and more readily appreciated from the following description of embodiments taken in conjunction with the accompanying drawings.

Figure 2:
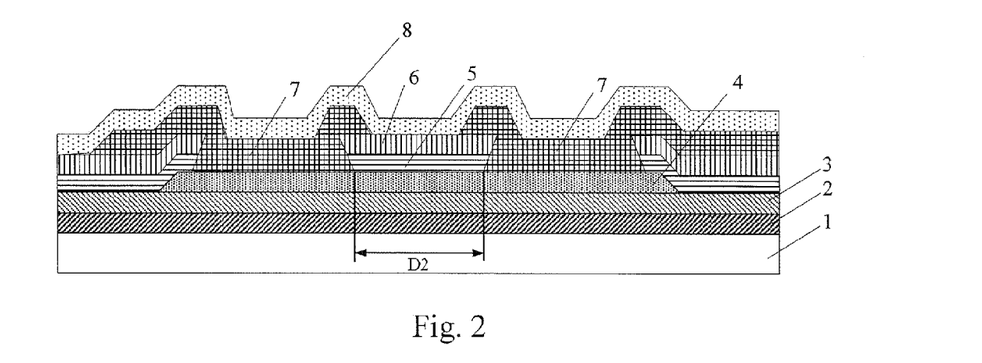
FIG. 2 is a schematic structural view of a thin film transistor according to an embodiment of the present invention.

In accordance with an aspect of the present invention, there is provided a thin film transistor. As shown in FIG. 2, the thin film transistor comprises a substrate 1, an active layer 4, a first etching barrier layer 5, a second etching barrier layer 6, a source and a drain which are arranged in sequence, wherein:

the active layer 4 is disposed over the substrate 1;

the first etching barrier layer 5 is disposed over the active layer 4;

the second etching barrier layer 6 is disposed over the first etching barrier layer 5, and the first etching barrier layer 5 and the second etching barrier layer 6 are used to protect a portion of the active layer 4 in a channel region between the source and the drain from being corroded by a developing solution and an etching solution;

the source and the drain are disposed over the second etching barrier layer 6, and are connected to each other through the active layer 4 by means of via holes which are formed in the first etching barrier layer 5 and the second etching barrier layer 6 by etching; and a length of the first etching barrier layer 5 at a channel position is less than a length of the second etching barrier layer 6 at the channel position. In other words, a tapered groove structure or a tapered via hole structure is formed in the first etching barrier layer 5 and the second etching barrier layer 6, thereby decreasing a distance between the source and the drain, i.e., a length of a channel of the thin film transistor, and shortening a transmission distance of carriers between the source and the drain.

The first etching barrier layer and the second etching barrier layer are made of materials that can stop the developing solution and the etching solution, such as one or more of an oxide of silicon (SiOx), a nitride of silicon (SiNx), an oxide of hafnium (HfOx), and an oxynitride of silicon (SiON). The materials such as the oxide of silicon (SiOx) are not sensitive to the etching solution for the source and the drain and the developing solution, and have good dielectric property and property of stopping vapor and oxygen gas. Therefore, when the abovementioned materials are used to manufacture the etching barrier layer, they can stop adverse influence of the etching solution for the source and the drain and the developing solution on the active layer 4 and can satisfy characteristic requirements of the metal oxide thin film transistor.

It should be particularly noted that in the present invention, the first etching barrier layer 5 has a greater etch rate than the second etching barrier layer 6. In this way, after the etching is completed, an etched portion of the first etching barrier layer having a greater etch rate is greater than an etched portion of the second etching barrier layer having a smaller etch rate. In other words, a tapered groove structure or a tapered via hole structure is formed in the first etching barrier layer 5 and the second etching barrier layer 6.

In an embodiment of the present invention, the first etching barrier layer 5 and the second etching barrier layer 6 are made of the same material such as silicon oxide, but a deposition rate for forming the first etching barrier layer 5 is greater than that for the second etching barrier layer 6. As a result, the first etching barrier layer 5 has a greater etch rate than the second etching barrier layer 6.

In another embodiment of the present invention, the first etching barrier layer 5 and the second etching barrier layer 6 are made of different materials. For example, the first etching barrier layer 5 is made of silicon nitride which is relatively prone to be etched, while the second etching barrier layer 6 is made of silicon oxide which is relatively difficult to be etched. In this way, the first etching barrier layer 5 can also have a greater etch rate than the second etching barrier layer 6.

In an example of the present invention, the via holes in the first etching barrier layer 5 and the second etching barrier layer 6 are formed in the first etching barrier layer 5 and the second etching barrier layer 6 by a single etching process.

It should be noted that the materials and methods for manufacturing the first etching barrier layer 5 and the second etching barrier layer 6 are not particularly limited in the present invention, and any appropriate materials and manufacturing methods, which can cause the first etching barrier layer 5 to have a greater etch rate than the second etching barrier layer 6, fall within the protection scope of the present invention.

Optionally, materials for manufacturing the substrate 1 comprise glass, silicon sheet, quartz, plastic, and the like. For example, the material for manufacturing the substrate 1 is glass.

The active layer 4 is made of metal oxide semiconductor material. For example, the metal oxide semiconductor material comprises oxide semiconductor materials having a high mobility of carriers, such as zinc oxynitride (ZnON), indium gallium zinc oxide (IGZO), indium zinc oxide (IZO), indium tin zinc oxide (ITZO) and the like.

The source and the drain are made of electrically conductive material. For example, the electrically conductive material comprises metal materials, e.g., common metals such as aluminum, zinc, tin, molybdenum, tungsten, titanium and the like, or metal alloy materials.

In the present invention, the source and the drain are not particularly required to be specifically distinguished from each other since whether an electrode at a specific position is a source or a drain needs to be determined according to its connectional relationship with a pixel electrode. In the present application, the electrode connected with the pixel electrode is defined as the drain.

In an embodiment of the present invention, the thin film transistor further comprises a passivation layer 8 disposed over the source and the drain.

In addition, for a thin film transistor having a top-gate structure, the thin film transistor further comprises a gate insulation layer on the source 7 and the drain 7, and a gate on the gate insulation layer.

For a thin film transistor having a bottom-gate structure, the thin film transistor further comprises a gate insulation layer 3 beneath the active layer 4, and a gate 2 beneath the gate insulation layer 3, as shown in FIG. 2.

In the thin film transistor according to any one of the abovementioned embodiments, two etching barrier layers are disposed and the property that the first etching barrier layer at a lower position has a greater etch rate than the second etching barrier layer at an upper position is utilized. Therefore, an etched portion of the first etching barrier layer having a greater etch rate is greater than an etched portion of the second etching barrier layer having a smaller etch rate. A tapered groove structure or a tapered via hole structure is formed in the first etching barrier layer and the second etching barrier layer. When the thin film transistor is powered on, a channel is formed in a region between the source and the drain. In this way, a tapered groove structure or a tapered via hole structure is formed in the first etching barrier layer and the second etching barrier layer, thereby shortening a transmission distance of carriers between the source and the drain, and thus reducing a length of the channel of the thin film transistor. As a result, the length D2 of the channel of the thin film transistor according to the abovementioned technical solutions of the present invention is less than a length D1 of a channel of a conventional thin film transistor, as shown in FIG. 2. The length D2 of the channel of the thin film transistor that can be achieved according to current accuracy of equipment and limitation of technology can be decreased by 1.0 μm-3.0 μm with respect to the length of the channel of the conventional thin film transistor. Because of the small length of the channel, a size of the thin film transistor can be reduced, an aperture ratio of a liquid crystal panel is increased, and energy consumption is reduced. In addition, because of the small length of the channel, a turn-on current of the thin film transistor can be increased, and a charging efficiency is raised, so that whole performance of the thin film transistor is greatly improved, thereby facilitating development of high-resolution products.

In accordance with another aspect of the present invention, there is also provided an array substrate comprising the thin film transistor described in any one of the above embodiments.

In accordance with a further aspect of the present invention, there is also provided a display apparatus comprising the abovementioned array substrate.

In accordance with a still another aspect of the present invention, there is also provided a method of manufacturing a thin film transistor, and the method comprises the following steps.

At step 1, a semiconductor layer is formed over a substrate 1 and the semiconductor layer is patterned so as to obtain an active layer 4.

Optionally, materials for manufacturing the substrate 1 comprise glass, silicon sheet, quartz, plastic, and the like. For example, the material for manufacturing the substrate 1 is glass.

The active layer 4 is of a metal oxide. For example, the active layer 4 is of oxide semiconductor materials having a high mobility of carriers, such as zinc oxynitride (ZnON), indium gallium zinc oxide (IGZO), indium zinc oxide (IZO), indium tin zinc oxide (ITZO) and the like.

The semiconductor layer may be formed by sputtering technology or plasma chemical vapor deposition (PECVD) technology. In the present invention, manners for forming the semiconductor layer are not particularly limited.

Optionally, the semiconductor layer is patterned by gray-tone mask exposing technology so as to form the active layer 4.

At step 2, a first etching barrier material layer is formed on the active layer 4.

At step 3, a second etching barrier material layer is formed on the first etching barrier material layer. The first etching barrier material layer and the second etching barrier material layer are patterned so as to obtain a first etching barrier layer 5 and a second etching barrier layer 6 which are patterned. The first etching barrier layer 5 and the second etching barrier layer 6 are used to protect a portion of the active layer 4 in a channel region between the source and the drain from being corroded by a developing solution and an etching solution.

The first etching barrier material layer and the second etching barrier material layer are obtained by common semiconductor forming technology such as plasma chemical vapor deposition.

The first etching barrier material layer and the second etching barrier material layer are patterned by common patterning processes such as exposing, developing, and etching.

After the patterning, via holes are formed in the first etching barrier layer 5 and the second etching barrier layer 6 by etching, such that a length of the first etching barrier layer 5 at a channel position is less than a length of the second etching barrier layer 6 at the channel position. In other words, a tapered groove structure or a tapered via hole structure is formed in the first etching barrier layer 5 and the second etching barrier layer 6, thereby decreasing a distance between the source and the drain, i.e., a length of a channel of the thin film transistor, and shortening a transmission distance of carriers between the source and the drain.

The first etching barrier material layer and the second etching barrier material layer are made of materials that can stop the developing solution and the etching solution, such as one or more of an oxide of silicon (SiOx), a nitride of silicon (SiNx), an oxide of hafnium (HfOx), and an oxynitride of silicon (SiON). The materials such as the oxide of silicon (SiOx) are not sensitive to the etching solution for the source and the drain and the developing solution, and have good dielectric property and property of stopping vapor and oxygen gas. Therefore, when the abovementioned materials are used to manufacture the etching barrier layer, they can stop adverse influence of the etching solution for the source and the drain and the developing solution on the active layer 4 and can satisfy characteristic requirements of the metal oxide thin film transistor.

It should be particularly noted that in the present invention, the first etching barrier material layer has a greater etch rate than the second etching barrier material layer. In this way, after the etching is completed, an etched portion of the first etching barrier layer having a greater etch rate is greater than an etched portion of the second etching barrier layer having a smaller etch rate. In other words, a tapered groove structure or a tapered via hole structure is formed in the first etching barrier layer 5 and the second etching barrier layer 6. As a result, the length of the channel of the thin film transistor is decreased, as shown in FIG. 3E.

In an embodiment of the present invention, the first etching barrier material layer and the second etching barrier material layer are made of the same material such as silicon oxide, but a deposition rate for forming the first etching barrier material layer is greater than that for the second etching barrier material layer. Thereby, the first etching barrier material layer has a greater etch rate than the second etching barrier material layer.

In another embodiment of the present invention, the first etching barrier material layer and the second etching barrier material layer are made of different materials. For example, the first etching barrier material layer is made of silicon nitride which is relatively prone to be etched, while the second etching barrier material layer is made of silicon oxide which is relatively difficult to be etched. In this way, the first etching barrier material layer can also have a greater etch rate than the second etching barrier material layer.

In an example of the present invention, the via holes in the first etching barrier layer 5 and the second etching barrier layer 6 are formed in the first etching barrier layer 5 and the second etching barrier layer 6 by a single etching process.

It should be noted that the materials and methods for manufacturing the first etching barrier material layer and the second etching barrier material layer are not particularly limited in the present invention, and any appropriate materials and manufacturing methods, which can cause the first etching barrier material layer to have a greater etch rate than the second etching barrier material layer, fall within the protection scope of the present invention.

At step 4, an electrode material layer is formed on the second etching barrier layer 6, and the electrode material layer is patterned so as to obtain a source 7 and a drain 7. The source 7 and the drain 7 are connected to each other through the active layer 4 by means of the via holes formed in the first etching barrier layer 5 and the second etching barrier layer 6.

The electrode material layer is made of electrically conductive material. For example, the electrically conductive material comprises metal materials, e.g., common metals such as aluminum, zinc, tin, molybdenum, tungsten, titanium and the like, or metal alloy materials.

Optionally, the source 7 and the drain 7 may be formed by patterning processes such as exposing, developing, and etching.

In the present invention, the source and the drain are not particularly required to be specifically distinguished from each other since whether an electrode at a specific position is a source or a drain needs to be determined according to its connectional relationship with a pixel electrode. In the present application, the electrode connected with the pixel electrode is defined as the drain.

In an embodiment of the present invention, the method further comprises a step of forming a passivation layer 8 on the source 7 and the drain 7, after the source 7 and the drain 7 are formed.

In addition, when a thin film transistor having a top-gate structure is manufactured, the method further comprises forming a gate insulation layer on the source 7 and the drain 7, and forming a gate on the gate insulation layer.

When a thin film transistor having a bottom-gate structure is manufactured, the method further comprises, before forming the active layer 4, a step of forming a gate 2 on the substrate 1 and forming a gate insulation layer 3 on the substrate formed with the gate layer 2.

The technical solution of the present invention is now described in more detail by taking a thin film transistor having a bottom-gate structure as an example. As shown in FIG. 3, a method of manufacturing the thin film transistor having a bottom-gate structure comprises the following steps.

Figure 3A:
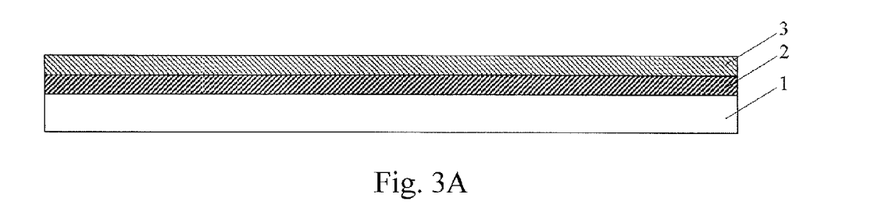
FIG. 3 is a manufacturing process flow diagram of a thin film transistor according to an embodiment of the present invention.

At step 1, a gate material layer and a gate insulation material layer are formed on a substrate 1 in sequence, and are patterned so as to obtain a gate 2 and a gate insulation layer 3, as shown in FIG. 3A.

Optionally, materials for manufacturing the substrate 1 comprise glass, silicon sheet, quartz, plastic, and the like. For example, the material for manufacturing the substrate 1 is glass.

The gate 2 is made of an electrically conductive material such as metal material and semiconductor material. For example, the gate 2 is made of metal material.

Optionally, the gate insulation layer 3 may be deposited by a chemical vapor deposition (CVD) method, and may be made of an insulating material. The insulating material comprises silicon oxide, silicon nitride, silicon oxynitride, and the like, or any combination thereof.

Figure 3B:
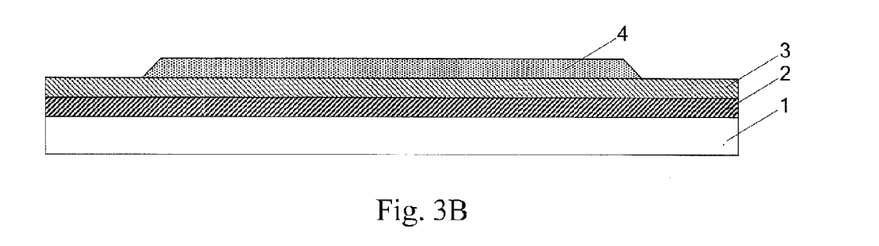

At step 2, a semiconductor layer is formed on the gate insulation layer 3, and is patterned so as to obtain an active layer 4, as shown in FIG. 3B.

The active layer 4 is of a metal oxide. The active layer 4 may be of oxide semiconductor materials having a high mobility of carriers, such as oxide semiconductor materials including zinc oxynitride (ZnON), indium gallium zinc oxide (IGZO), indium zinc oxide (IZO), indium tin zinc oxide (ITZO) and the like.

The semiconductor layer may be formed by sputtering technology or plasma chemical vapor deposition (PECVD) technology. In the present invention, manners for forming the semiconductor layer are not particularly limited.

Optionally, the semiconductor layer is patterned by graytone mask exposing technology so as to form the active layer 4.

Figure 3C:
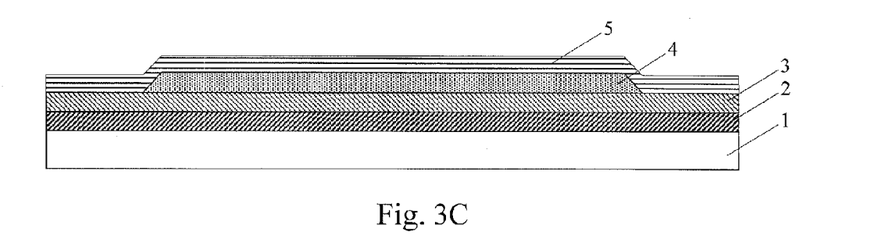

At step 3, a first etching barrier material layer is formed on the active layer 4, as shown in FIG. 3C.

Figure 3D:
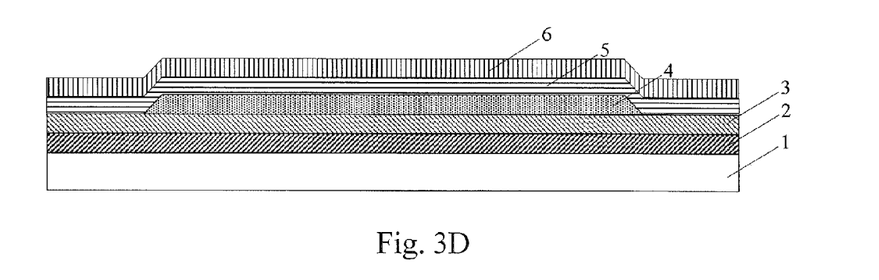
Figure 3E:
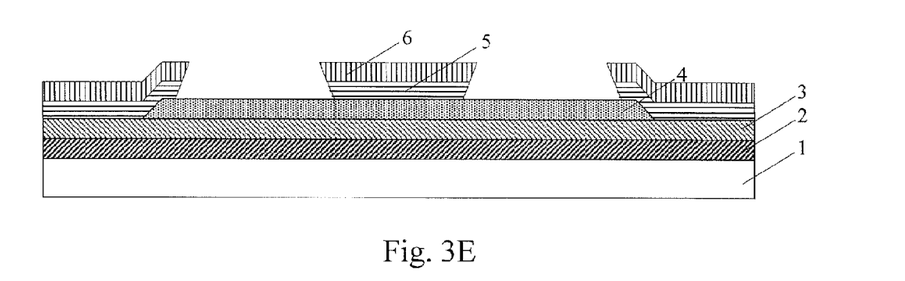

At step 4, a second etching barrier material layer is formed on the first etching barrier material layer, as shown in FIG. 3D, and the first etching barrier material layer and the second etching barrier material layer are patterned so as to obtain a first etching barrier layer 5 and a second etching barrier layer 6 which are patterned, as shown in FIG. 3E. The first etching barrier layer 5 and the second etching barrier layer 6 are used to protect a portion of the active layer 4 in a channel region between the source and the drain from being corroded by a developing solution and an etching solution.

The first etching barrier material layer and the second etching barrier material layer are obtained by common semiconductor layer forming technology such as plasma chemical vapor deposition.

The first etching barrier material layer and the second etching barrier material layer are patterned by common patterning processes such as exposing, developing, and etching.

After the patterning, via holes are formed in the first etching barrier layer 5 and the second etching barrier layer 6 by etching, such that a length of the first etching barrier layer 5 at a channel position is less than a length of the second etching barrier layer 6 at the channel position. In other words, a tapered groove structure or a tapered via hole structure is formed in the first etching barrier layer 5 and the second etching barrier layer 6, thereby decreasing a distance between the source and the drain, i.e., a length of a channel of the thin film transistor, and shortening a transmission distance of carriers between the source and the drain.

The first etching barrier material layer and the second etching barrier material layer are made of materials that can stop the developing solution and the etching solution, such as one or more of an oxide of silicon (SiOx), a nitride of silicon (SiNx), an oxide of hafnium (HfOx), and an oxynitride of silicon (SiON). The materials such as the oxide of silicon (SiOx) are not sensitive to the etching solution for the source and the drain and the developing solution, and have good dielectric property and property of stopping vapor and oxygen gas. Therefore, when the abovementioned materials are used to manufacture the etching barrier layer, they can stop adverse influence of the etching solution for the source and the drain and the developing solution on the active layer 4 and can satisfy characteristic requirements of the metal oxide thin film transistor.

It should be particularly noted that in the present invention, the first etching barrier material layer has a greater etch rate than the second etching barrier material layer. In this way, after the etching is completed, an etched portion of the first etching barrier layer having a greater etch rate is greater than an etched portion of the second etching barrier layer having a smaller etch rate. In other words, a tapered groove structure or a tapered via hole structure is formed in the first etching barrier layer 5 and the second etching barrier layer 6. As a result, the length of the channel of the thin film transistor is decreased, as shown in FIG. 3E.

Various methods may be used to achieve the solution in which the first etching barrier material layer has a greater etch rate than the second etching barrier material layer, thereby forming the tapered groove structure or the tapered via hole structure.

In an embodiment of the present invention, the first etching barrier material layer and the second etching barrier material layer are made of the same material such as silicon oxide, but a deposition rate for forming the first etching barrier material layer is greater than that for the second etching barrier material layer. Thereby, the first etching barrier material layer has a greater etch rate than the second etching barrier material layer. For example, table 1 may be referred to for specific deposition parameters of the first etching barrier material layer, while table 2 may be referred to for specific deposition parameters of the second etching barrier material layer.

TABLE 1

| Substrate Temperature (° C.) | RF Power (watt) | Spacing (mils) | Gas Pressure (mTorr) | Gas Flow Rate (sccm) |
| --- | --- | --- | --- | --- |
| 150 | 800 | 710 | 1500 | SiH$_4$ 85<br>N$_2$O 2000<br>N$_2$ 200 |

TABLE 2

| Substrate Temperature (° C.) | RF Power (W) | Spacing (mils) | Gas Pressure (mTorr) | Gas Flow Rate (sccm) |
| --- | --- | --- | --- | --- |
| 150 | 800 | 710 | 1500 | SiH$_4$ 50<br>N$_2$O 2000<br>N$_2$ 200 |

In another embodiment of the present invention, the first etching barrier material layer and the second etching barrier material layer are made of different materials. For example, the first etching barrier material layer is made of silicon nitride which is relatively prone to be etched, while the second etching barrier material layer is made of silicon oxide which is relatively difficult to be etched. In this way, the first etching barrier material layer can also have a greater etch rate than the second etching barrier material layer.

It should be noted that the materials and methods for manufacturing the first etching barrier material layer and the second etching barrier material layer are not particularly limited in the present invention, and any appropriate materials and manufacturing methods, which can cause the first etching barrier material layer to have a greater etch rate than the second etching barrier material layer, fall within the protection scope of the present invention.

Figure 3F:
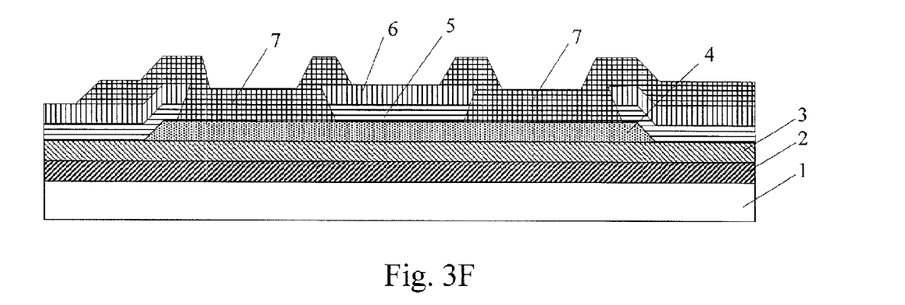

At step 5, an electrode material layer is formed on the second etching barrier layer 6, and the electrode material layer is patterned so as to obtain a source 7 and a drain 7, as shown in FIG. 3F. The source 7 and the drain 7 are connected to each other through the active layer 4 by means of the via holes formed in the first etching barrier layer 5 and the second etching barrier layer 6.

The electrode material layer is made of electrically conductive material. For example, the electric conducting material comprises metal materials. The metal materials comprise common metals such as aluminum, zinc, tin, molybdenum, tungsten, titanium and the like, or metal alloy materials.

Optionally, the source 7 and the drain 7 may be formed by patterning processes such as exposing, developing, and etching.

In the present invention, the source and the drain are not particularly required to be specifically distinguished from each other since whether an electrode at a specific position is a source or a drain needs to be determined according to its connectional relationship with a pixel electrode. In the present application, the electrode connected with the pixel electrode is defined as the drain.

Figure 3G:
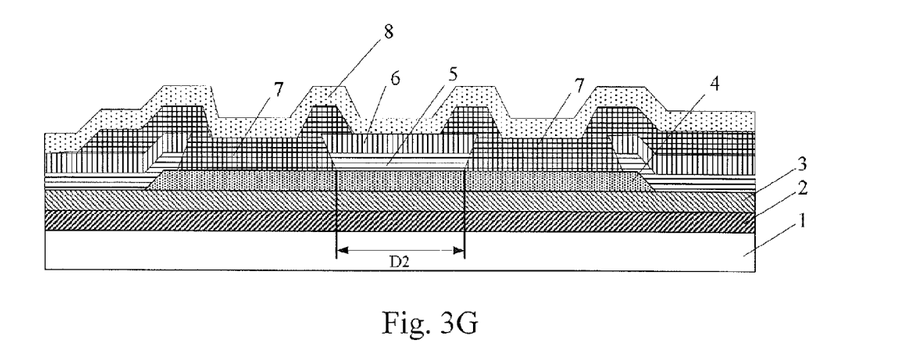

At step 6, a passivation layer 8 is formed on the source 7 and the drain 7, as shown in FIG. 3G.

In the thin film transistor manufactured according to the manufacturing method described in any one of the abovementioned embodiments, two etching barrier layers are disposed and the property that the first etching barrier layer at a lower position has a greater etch rate than the second etching barrier layer at an upper position is utilized. Therefore, an etched portion of the first etching barrier layer having a greater etch rate is greater than an etched portion of the second etching barrier layer having a smaller etch rate. A tapered groove structure or a tapered via hole structure is formed in the first etching barrier layer and the second etching barrier layer. In this way, a tapered groove structure or a tapered via hole structure is formed in the first etching barrier layer and the second etching barrier layer, thereby shortening a transmission distance of carriers between the source and the drain, and thus reducing a length of the channel of the thin film transistor. As a result, the length D2 of the channel of the thin film transistor manufactured according to the abovementioned technical solutions of the present invention is less than a length D1 of a channel of a thin film transistor manufactured by a conventional technology. The length D2 of the channel of the thin film transistor that can be achieved according to current accuracy of equipment and limitation of technology can be decreased by 1.0 μm-3.0 μm with respect to the length of the channel of the conventional thin film transistor. Because of the small length of the channel, a size of the thin film transistor can be reduced, an aperture ratio of a liquid crystal panel is increased, and energy consumption is reduced. In addition, because of the small length of the channel, a turn-on current of the thin film transistor can be increased, and a charging efficiency is improved, so that whole performance of the thin film transistor is greatly improved, thereby facilitating development of high-resolution products.

The object, technical solutions, and advantageous effect of the present invention are further described in detailed in the above specific embodiments. It should be appreciated that the above description is only specific embodiments of the present invention and the embodiment is not used to limit the present invention. It will be understood by those skilled in the art that various modifications, equivalent substitutions and improvements may be made therein without departing from the principles and spirit of the present invention and fall within the scope of the present invention.

What is claimed is:

1. A thin film transistor comprising: a substrate, an active layer, a first etching barrier layer, a second etching barrier layer, a source and a drain, wherein:
    the active layer is disposed over the substrate;
    the first etching barrier layer is disposed over the active layer;
    the second etching barrier layer is disposed over the first etching barrier layer;
    the source and the drain are disposed over the second etching barrier layer, and are connected to each other through the active layer by means of via holes which are formed in the first etching barrier layer and the second etching barrier layer by etching; and
    a length of the first etching barrier layer at a channel position is less than a length of the second etching barrier layer at the channel position.

2. The thin film transistor of claim 1, wherein:
    the first etching barrier layer has a greater etch rate than the second etching barrier layer.

3. The thin film transistor of claim 1, wherein:
    a deposition rate for forming the first etching barrier layer is greater than that for the second etching barrier layer.

4. The thin film transistor of claim 1, wherein:
    both the first etching barrier layer and the second etching barrier layer are made of silicon oxide; or the first etching barrier layer is made of silicon nitride while the second etching barrier layer is made of silicon oxide.

5. The thin film transistor of claim 1, further comprising:
    a passivation layer disposed over the source and the drain.

6. The thin film transistor of claim 1, wherein:
    the active layer is made of metal oxide semiconductor material.

7. The thin film transistor of claim 1, wherein:
    the via holes are formed in the first etching barrier layer and the second etching barrier layer through a single etching process.

8. An array substrate comprising the thin film transistor according to claim 1.

9. The thin film transistor of claim 2, wherein:
    the via holes are formed in the first etching barrier layer and the second etching barrier layer through a single etching process.

10. A method of manufacturing a thin film transistor comprising:
    forming a semiconductor layer over a substrate and patterning the semiconductor layer so as to obtain an active layer;
    forming a first etching barrier material layer on the active layer;
    forming a second etching barrier material layer on the first etching barrier material layer;
    forming, by etching, via holes in the first etching barrier layer and the second etching barrier layer such that a length of the first etching barrier layer at a channel position is less than a length of the second etching barrier layer at the channel position; and
    forming an electrode material layer on the second etching barrier layer, and patterning the electrode material layer so as to obtain a source and a drain, wherein the source and the drain are connected to each other through the active layer by means of the via holes formed in the first etching barrier layer and the second etching barrier layer.

11. The method of claim 10, wherein:
    the first etching barrier layer has a greater etch rate than the second etching barrier layer.

12. The method of claim 10, wherein:
    a deposition rate for forming the first etching barrier layer is greater than that for the second etching barrier layer.

13. The method of claim 10, wherein:
    both the first etching barrier material layer and the second etching barrier material layer are made of silicon oxide; or the first etching barrier layer is made of silicon nitride while the second etching barrier layer is made of silicon oxide.

14. The method of claim 10, wherein:
    the active layer is made of metal oxide semiconductor material.

15. The method of claim 10, further comprising a step of forming a passivation layer on the source and the drain after the source and the drain are formed.

16. The method of claim 10, wherein:
    the via holes are formed in the first etching barrier layer and the second etching barrier layer through a single etching process.

17. The method of claim 12, wherein:
    both the first etching barrier layer and the second etching barrier layer are made of silicon oxide; or the first etching barrier layer is made of silicon nitride while the second etching barrier layer is made of silicon oxide.

* * * * *